United States Patent [19]

Sasaki et al.

[11] Patent Number: 5,581,508

[45] Date of Patent: Dec. 3, 1996

[54] SEMICONDUCTOR MEMORY HAVING SUB-WORD LINE REPLACEMENT

[75] Inventors: Toshio Sasaki, Tokyo; Toshihiro Tanaka, Akigawa; Atsushi Nozoe, Ome; Hitoshi Kume, Musashino, all of Japan

[73] Assignee: Hitachi, Ltd., Tokyo, Japan

[21] Appl. No.: 352,619

[22] Filed: Dec. 9, 1994

[30] Foreign Application Priority Data

Dec. 22, 1993 [JP] Japan .................................. 5-324826

[51] Int. Cl.$^6$ .................................................... G11C 7/00
[52] U.S. Cl. ............... 365/200; 365/230.03; 365/230.06; 371/10.2
[58] Field of Search ............................. 365/200, 230.03, 365/189.07, 230.06; 371/10.1, 10.2, 10.3

[56] References Cited

U.S. PATENT DOCUMENTS 5,033,024  7/1991  O'Connell et al. ................. 365/189.01
5,060,197 10/1991  Park et al. ............................. 365/200
5,255,228 10/1993  Hatta et al. ........................... 365/200
5,299,161  3/1994  Takeuchi et al. ..................... 365/201
5,379,258  1/1995  Murakami et al. ................... 365/200

FOREIGN PATENT DOCUMENTS 4143999  5/1992  Japan .

*Primary Examiner*—David C. Nelms
*Assistant Examiner*—Son Dinh
*Attorney, Agent, or Firm*—Antonelli, Terry, Stout & Kraus

[57] ABSTRACT

In a semiconductor memory apparatus having a row decoder classified by main word lines and word lines, the number of spare lines for a defect is increased without increasing the number of spare main word lines. The area of a redundancy circuit is minimized to improve the yield of chip. Normal and spare memory blocks each including a plurality of memory cells are each divided so that replacement may be effected without increasing the number of spare main word lines even when defective addresses associated with a plurality of normal main word lines take place.

4 Claims, 5 Drawing Sheets

SEMICONDUCTOR MEMORY HAVING SUB-WORD LINE REPLACEMENT

BACKGROUND OF THE INVENTION

The present invention relates to a semiconductor memory apparatus.

In the semiconductor memory apparatus, it has hitherto been practice to provide spare lines and spare memory cells in expectation of occurrence of a defect in a memory cell or word line.

Figure 5:
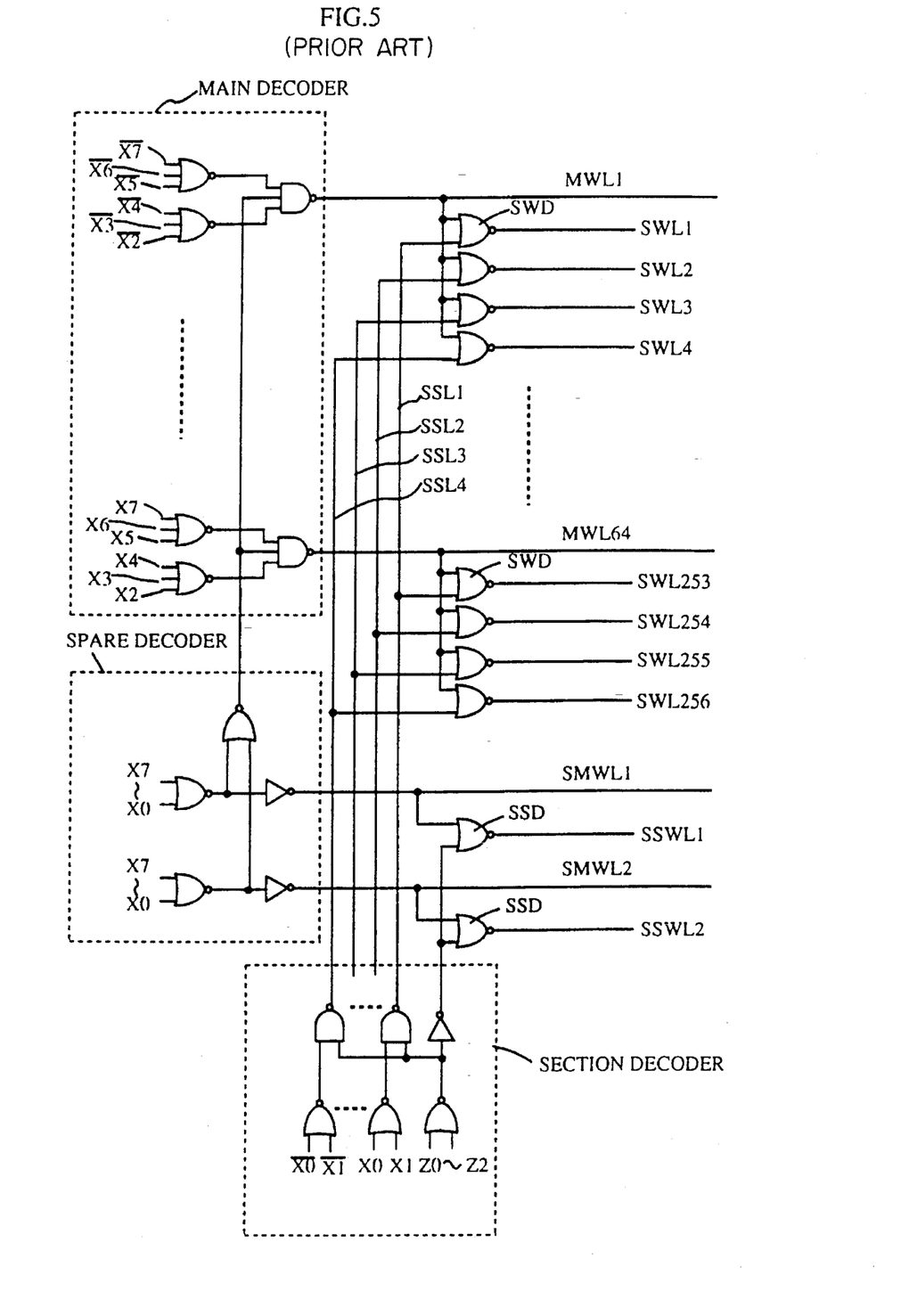
FIG. 5 is a circuit diagram showing a row selection circuit of a prior art semiconductor memory.

FIG. 5 is a schematic diagram of a row selection circuit in a prior art semiconductor memory.

In the semiconductor memory apparatus described in, for example, JP-A-4-143999, a redundancy select circuit of row direction is provided which is comprised of a main decoder and a section decoder as shown in FIG. 5. The row selection circuit of FIG. 5 comprises circuits including a memory cell array connected to fore ends of subword lines SWL1 to SWL256, a redundancy cell array connected to fore ends of spare subword lines SSWL1 and SSWL2, main word lines MWL1 to MWL64, section selection lines SSL1 to SSL4, spare main word lines SMWL1 to SMWL2, a main decoder for selecting one main word line in accordance with a first row address, a section decoder for selecting one section selection line in accordance with a second row address and a section address, section word drivers SWD for selecting one row on the basis of potential on the main word line and section selection line, a spare decoder and spare section drivers SSD.

With this construction, in the event that a row address selected on the basis of first and second row addresses is an address of a defective cell row, the spare main word lines SMWL1 and SMWL2 are selected by the spare decoder and one row of the redundancy cell array is selected by a spare section driver SSD. Through this, the number of redundancy cell arrays in the semiconductor memory apparatus can easily be decreased to one for one by the spare subword lines SSWL1 and SSWL2.

With the above construction, however, in the event that a plurality of memory blocks become defective at a time by a plurality of defective addresses in a memory array in which one memory block is constructed of a plurality of memory cells, a great number of main word lines of memory blocks associated with the individual defective addresses are needed and when these main word lines are laid, the number of main decoders increases to raise the ratio of occupation of these word lines in the chip area and as a result, the yield is decreased.

If one main decoder is laid for the plurality of word lines of the memory block comprised of the plurality of memory cells to relatively simplify the construction, then one main word line per one row (one cell) will be needed in the prior art layout of redundancy line, thus making it difficult to arrange the decoder.

Further, when replacement is carried out memory block by memory block, even many sound word lines are replaced with an added spare word line group, raising a problem that the replacement efficiency of redundance is decreased.

SUMMARY OF THE INVENTION

A first object of the present invention is to solve the prior art problems and to provide a semiconductor memory apparatus of a word line division configuration having a plurality of memory cells in one memory block and a row decode circuit classified by main word lines and word lines of memory cells, wherein even in expectation of occurrence of defects in a plurality of different memory blocks, main word lines need not be laid by the number of defective memory blocks associated with the individual defective addresses to ensure that the number of main drivers for driving the main word lines can be decreased and the ratio of an area occupied by the main drivers in the chip area can be decreased.

A second object of the present invention is to provide a semiconductor memory apparatus which can prevent an increase in area occupied by the main drivers in the redundancy circuit.

A third object of the present invention is to provide a semiconductor memory apparatus which can achieve the high yield by dividing the memory block by making the number of spare word lines to be replaced with normal word lines proper for the size of foreign matter and the particle size of crystal defect.

Figure 1:
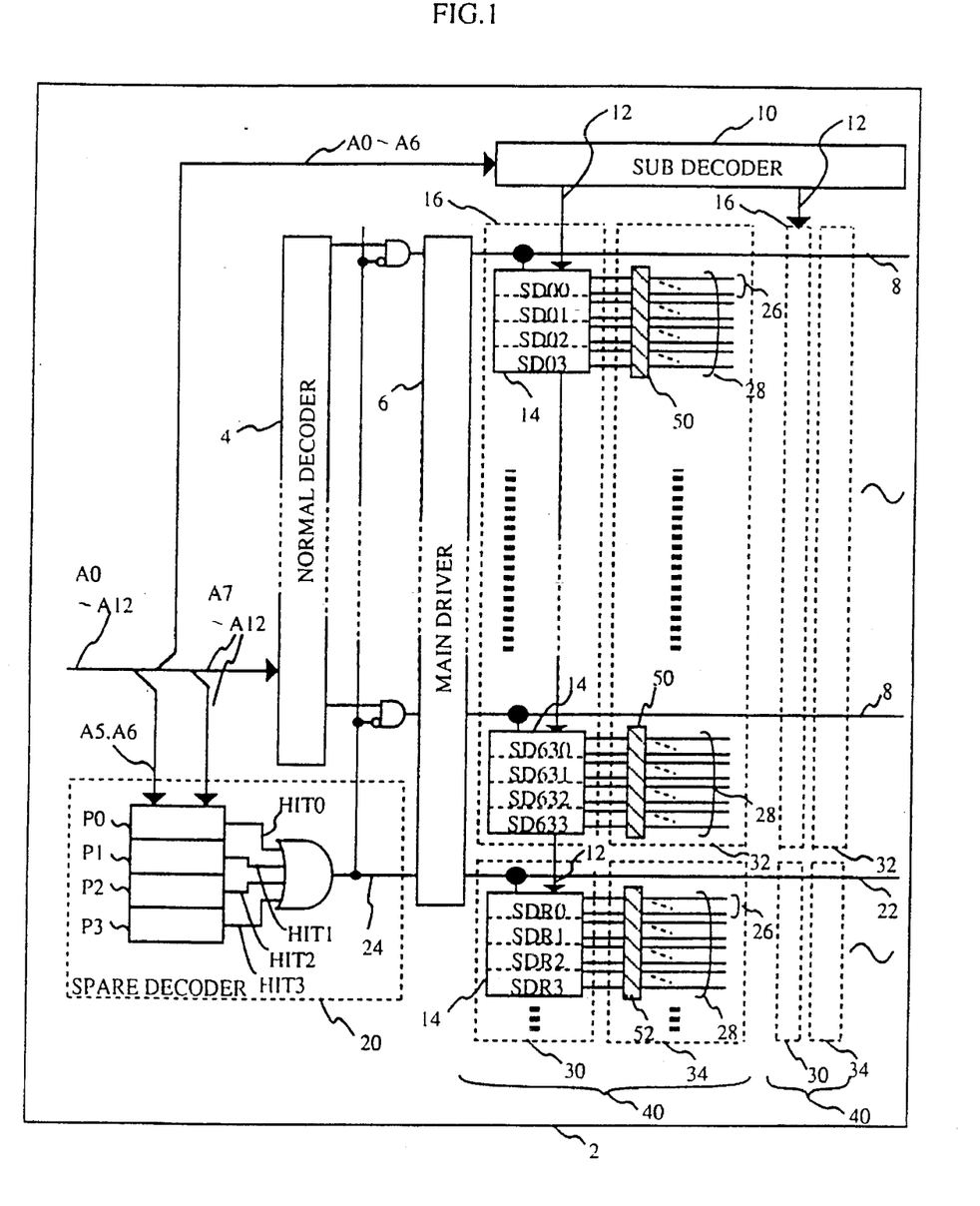
FIG. 1 is a block diagram of a semiconductor memory apparatus showing a first embodiment of the present invention.

To accomplish the above objects, (a) In an embodiment of a semiconductor memory apparatus of the present invention as shown in FIG. 1 constructed of a classified decode circuit comprised of normal main word lines (8) selectable by a first row address and a subword selection line (12) for providing a signal in response to a second row address to select one of a plurality of memory cell word lines (28) of memory cells, word lines (28) of respective normal memory blocks (50) arranged in the row and column directions in a normal memory array (32) and of a spare memory block (52) in a spare memory array (34) are divided into word line groups (26) each having a plurality of word lines controlled by a partial address of the second row address. At that time, a spare decoder (20) comprised of coincidence comparison circuits (P0 to P3) for performing coincidence comparison of an external address with a defective address stored in advance produce, as outputs of the coincidence comparison circuits, coincidence detection signals (HIT0 to HIT3) the logical sum of which inhibits selection of any normal main word lines (8) in replacement operation of the defective address and selects a spare main word line (22). In addition, the defective address compared at the coincidence comparison circuit consists of the first row address for selection of the normal main word line 8 and the second row address for division of the normal and spare memory blocks.

Through this, at least one word line group (26) of a desired normal memory block (50) in the normal memory array (32) can be replaced with at least one word line group (26) of the spare memory block (52).

Figure 2:
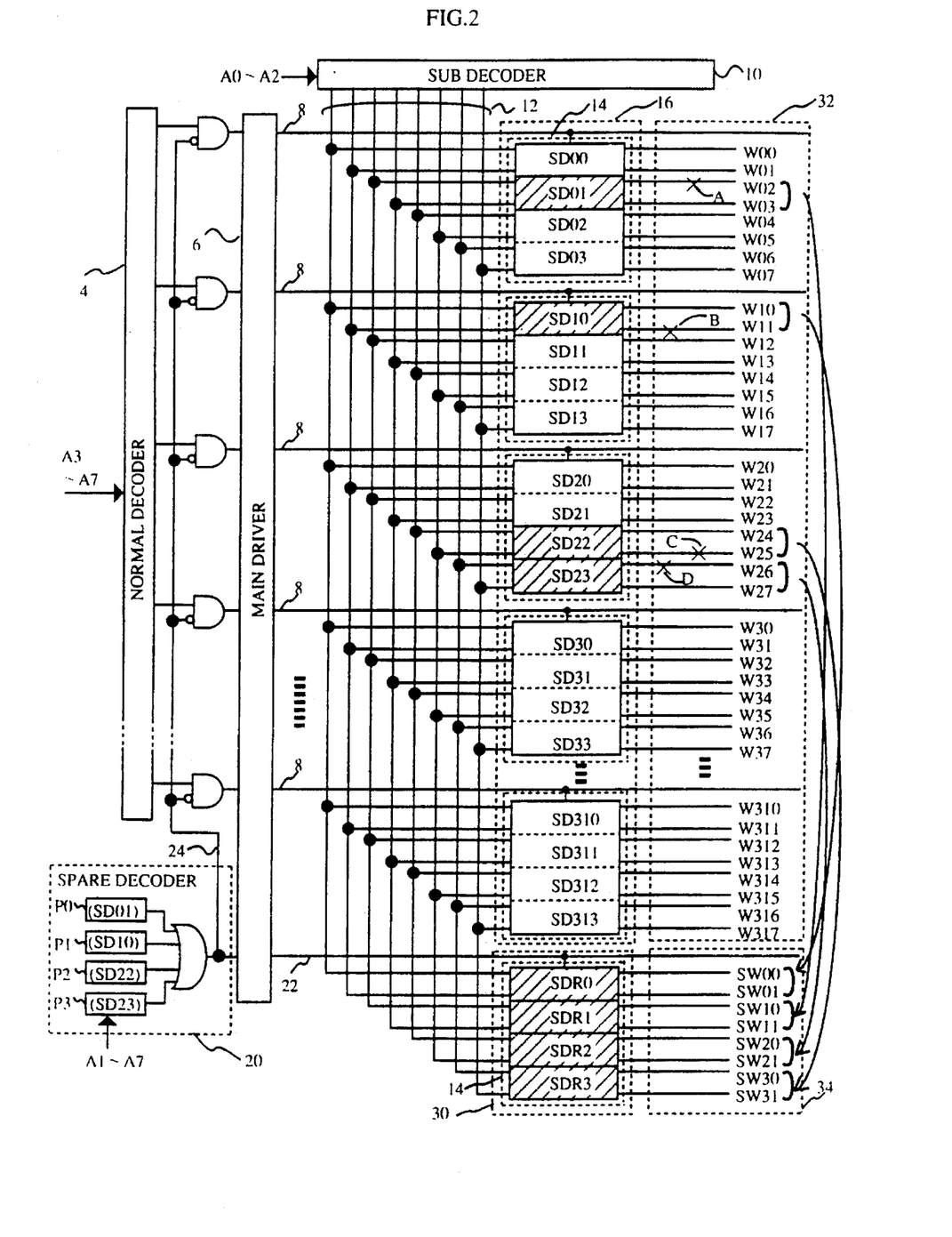
FIG. 2 is a block diagram of a semiconductor memory apparatus showing a second embodiment of the present invention.

(b) In another embodiment of the semiconductor memory apparatus of the present invention as shown in FIG. 2, a subword selection line (12) standing for the output of a subdecoder (10) applied with a second row address (A0 to A2 of FIG. 2) is connected to terminals of the normal memory block which correspond to those of the spare memory block. Further, the contents of a defective address to be stored in the coincidence comparison circuits (P0 to P3) is an address (A1 to A7) removed of an address A0 which is part of the second row address and is used to select a given word line associated with a subdriver.

Figure 3:
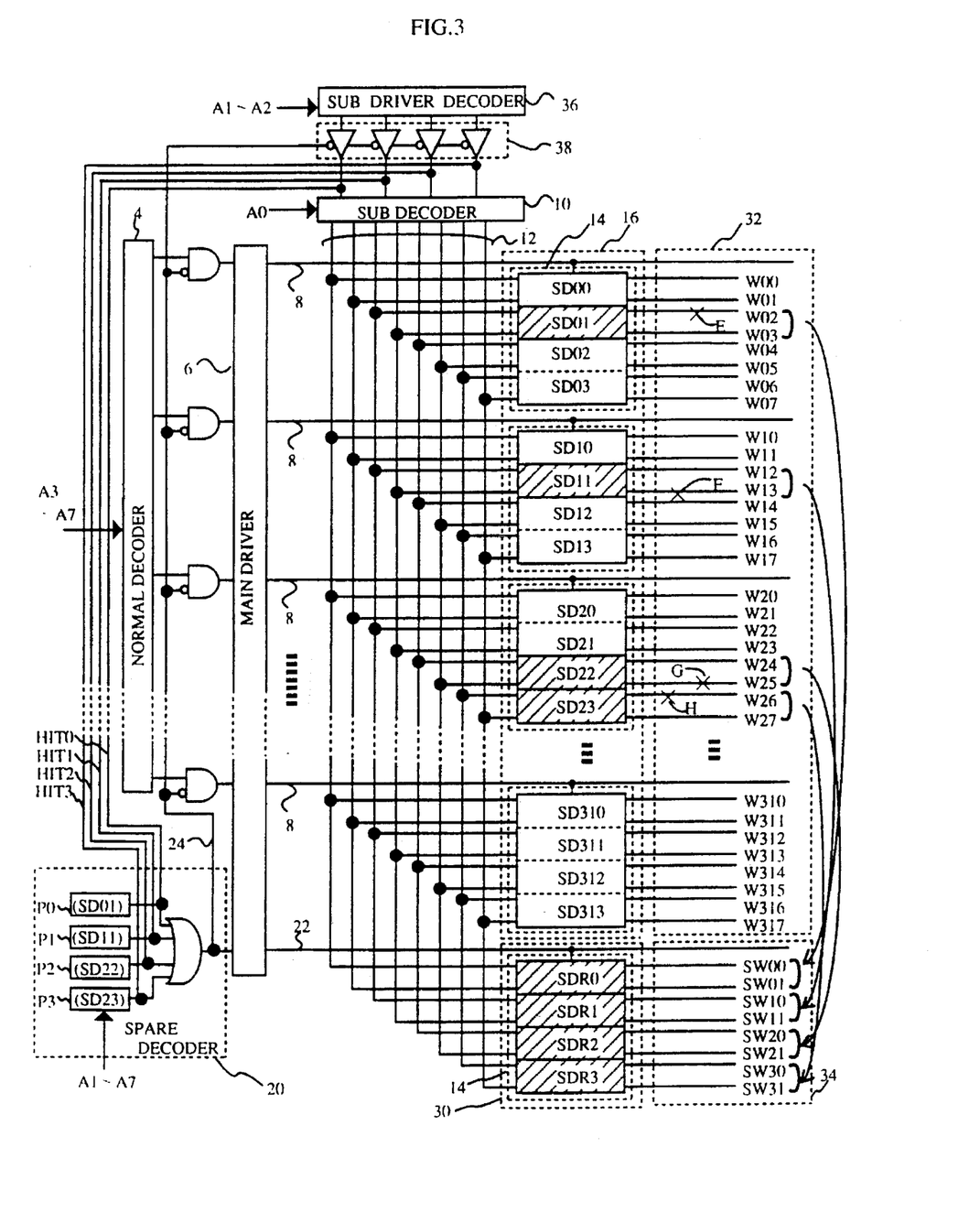
FIG. 3 is a block diagram of a semiconductor memory apparatus showing a third embodiment of the present invention.

(c) In a still another embodiment of the semiconductor memory apparatus shown in FIG. 3, a subdriver decoder (36) and a tri-state type driver (38) are added. In addition, part of a second address (A0) is inputted to the subdecoder (10) and the remainder of the second address represented by A1 to A2 is inputted to the subdriver decoder (36). Coincidence detection signals (HIT0 to HIT3) are connected to wiring lines between tri-state type driver (38) and subdecoder (10), respectively. The number of word lines of one word line group (26) of the normal memory block (50) is the same as that of word lines of one word line group (26) of the spare memory block (52). The number of addresses in the first and second row addresses and the division of the address into the first and second addresses have been described as being only for convenience of explanation of means for solving the problems in the present invention and the number of addresses in the first and second row addresses is not limitative.

Replacement of a new redundancy circuit can be effected in this manner to realize a minimal redundancy circuit area, thereby improving the yield of chip.

In the present invention, even when normal main word lines (8) in association with defective cells are associated with a plurality of different normal memory blocks (50) in the row direction, one spare main word line (22) can participate in replacement of one of word line groups (26), corresponding to the division of each of the plurality of different normal memory blocks (52), with one of word line groups (26) of the spare memory block (52). The size of defect and the number of word lines replaceable at a time can be determined by the number of division of the normal memory block and of the spare memory block. Especially, the number of word lines replaceable with defective word lines can be increased without increasing the number of drivers of the main driver (6) for driving the spare main word line (22). Accordingly, the area of the main driver can be decreased to thereby improve the yield of chip.

Also, in the present invention, as shown in FIG. 2, replacement of spare word line group (26) can be effected in a unit of word line group (26) connected to a desired main word line (8) in the normal memory array (32) in accordance with the order of a subdriver of a normal memory block (50) associated with a defective cell under the condition that the order of selection of addresses of subdrivers corresponding to the word line groups is fixed.

Further, in the present invention, as shown in FIG. 3, a second row address A0 to A2 is inputted to the subdecoder (10) in normal operation and a subdriver selects one word line in the normal memory array. On the other hand, in replacement operation, information represented by the coincidence detection signals HIT0 to HIT3 is set in place of the second row address A0 to A2 for selection of a subdriver in order that a desired subdriver in the spare memory block (52) can be selected and a given word line can be selected by a row address A0.

As a result, in the semiconductor memory apparatus, the position of a subdriver associated with a division of the normal memory block can be replaced freely with a subdriver of the spare memory block by the coincidence detection signal in a unit of subdriver for driving the memory block in the normal memory array. Especially, since the number of wiring lines of the subword selection line 12 for driving the subdrivers can be the same as that shown in FIG. 3, subdrivers associated with a plurality of different normal main word lines can be replaced by the same number as that of the signals of the subword selection line 12 and the layout area is in no way required to be increased.

DESCRIPTION OF THE PREFERRED EMBODIMENTS

Preferred embodiments of the present invention will be described hereunder in greater detail with reference to the accompanying drawings.

FIG. 1 is a schematic block diagram of a semiconductor memory apparatus showing an embodiment of the present invention. In FIG. 1, numeral 2 designates the semiconductor memory apparatus for storing information, 4 a normal decoder, 6 a main driver, 10 a subdecoder, and 12 a subword selecting line 12. Further, numeral 8 designates a normal main word line, 28 a plurality of word lines for selecting a plurality of memory cells, 50 a normal memory block comprised of a plurality of memory cells which are selected by a classified decode circuit consisting of the normal main word line 8 and word lines 28, and 52 a spare memory block having the same construction as the normal memory block at the least and serving as a spare part of the normal memory block. Denoted by SD00 to SD633 are a plurality of normal subdrivers each adapted to drive a word line of each memory cell in the normal memory block 50 and by SDR0 to SDR3 are spare subdrivers each adapted to drive a word line of each memory cell in the spare memory block 52.

Further, in FIG. 1, numeral 26 designates a word line group of each subdriver, for example, SD00, 14 a subdriver group of the subdrivers SD00 to SD03, . . . or SD630 to SD633 accessed through each normal main word line 8 and a subdriver group of the subdrivers SDR0 to SDR3, . . . accessed through each spare main word line 22. Also, numeral 16 designates a normal subdriver section comprised of the plurality of subdriver groups 14 and 30 a spare subdriver section comprised of the subdriver group 14 associated with the spare main word line 22 which is exemplified as being single herein. On the other hand, numeral 32 designates a normal memory array in which the plurality of normal memory blocks 50 are arranged in the row and column directions and 34 a spare memory array in which at least the spare memory block 52 is arranged in the row direction. Denoted by A0 to A12 is an address signal for selecting a row direction, by 20 a spare decoder, by 24 an inhibit signal for selecting the spare main word line 22 and inhibiting the selection of any normal main word lines 8, by P0 to P3 coincidence comparison circuits each adapted to store a defective address, occurring in the normal memory array 32, in a unit of address for selection of a subaddress and perform coincidence comparison of the defective address with an external address, and by HIT0 to HIT3 coincidence detection signals of the coincidence comparison circuits P0 to P3.

When coincidence occurs, one of the coincidence detection signals HIT0 to HIT3 assumes, for example, high level and a logical sum of these signals inhibits the selection of any normal main word lines 8. As indicated by 40, the memory arrangement in the column direction includes at least one memory array with subdrivers which consists of the subdriver sections 16 and 30 and the memory arrays 32 and 34.

Referring now to FIG. 1, the operation for replacing a defective address in the normal memory array 32 with the spare memory array 34 by means of the classified row decoder will be described.

Firstly, in normal operation without replacement, one of 64 main word lines is selected by means of the normal decoder 4 on the basis of a first row address A7 to A12 which is a divisional part of a row address. Subsequently, the subdecoder 10 responds to a second row address A0 to A6 which is the remainder of the row address to select one of 128 word lines in the normal memory block 50 on the basis of a potential level on a selected, given main word line 8.

On the other hand, in replacement operation, the coincidence comparison circuits P0 to P3 are applied with, in addition to the first row address A7 to A12, an address A5 to A6 forming part of the second row address and adapted to divide the memory block. When a defective address stored in one of the circuits P0 to P3 of the spare decoder 20 in accordance with a program coincides with an external address, that is, when a row address represented by A5 to A12 coincides with a defective address in the normal memory array, an inhibit signal 24 standing for a logical sum of the coincidence detection signals HIT0 to HIT3 of the coincidence comparison circuits inhibits the selecting operation of the main driver 6. At the same time, the spare decoder 20 selects the spare main word line 22. Consequently, a word line group 26 of spare memory block 52 corresponding to a given subdriver is selected on the basis of a potential level on the selected spare main word line 22 and one row in the word line group 26 is selected.

Further, even when defective addresses are present in association with a plurality of normal main word lines 8, the single spare main word line 22 in FIG. 1 is effective to replace individual word line groups 26 associated with the different normal main word lines 8 with a plurality of word line groups 26 associated with the spare main word line 22, respectively. In the present embodiment, since the memory block is divided into four by part of the second row address, A5 to A6, to permit the spare main word line 22 to participate in replacement of up to 4 word line groups and the address bit A0 to A6 is of $2^7=128$, a maximum of up to 32 defective word lines in a word line group 26 ($32=128 \div 4$) can be replaced collectively. Accordingly, the number of replaceable word lines can be increased without increasing the number of drivers in the main driver 6 participating in driving of the spare main word line 22.

As a result, the reduction of the area of the main driver 6 can be accomplished and the yield of chip can be improved. In addition, the number of replaceable word lines can also be increased without increasing the subdecoder 10 in number. For convenience of explanation of the present embodiment, an example of the size of the row address and the number of first and second addresses (A7 to A12 and A0 to A6) distributed in the row address has been described but the number of addresses and the division of the address are not limitative. In other words, the distribution in the address may be changed in various ways in accordance with the magnitude of memory capacity or the memory array configuration so as to optimize the electric characteristics of the memory and the chip area.

Next, a second embodiment of the present invention will be described by making reference to a block diagram of FIG. 2.

FIG. 2 illustrates, in block form, a concrete embodiment of the redundancy circuit shown in FIG. 1.

In FIG. 2, the same components as those in FIG. 1 are designated by identical reference numerals and only different components designated by different reference numerals will be described. Denoted by W00 to W317 are word lines of memory cells in the normal memory array 32 and by SW00 to SW31 are word lines of the memory in the spare memory array 34.

Further, A0 to A7 designate a row address, of which A3 to A7 represent a first row address and A0 to A2 represent a second row address. Subdrivers SD01, SD10, SD22 and SD23 hatched in the normal subdriver section 16 are illustrated as being in association with defective lines or defective memory cells as designated at A to D, respectively. Defective addresses are stored in the coincidence comparison circuits P0 to P3 in the spare decoder 20 in a unit of address for selection of subaddress. Wiring lines of the subword selection line 12 are connected to the subdrivers SD00 to SD313 associated with the normal memory array 32 and the subdrivers SDR0 to SDR3 of the spare memory array 34 at the corresponding input terminals.

Next, the operation of the present embodiment will be described. In normal operation, the fundamental operation is the same as that in FIG. 1 with the only exception that the number of row addresses is different and the manner of distribution of first and second row addresses differs. For example, in decoding of the normal memory array 32, the normal decoder 4 selects one main word line 8 and one row of the given one word line is activated by the subdecoder selection line 12 standing for an output of the subdecoder 10. At that time, the spare memory array 34 is in the deselection state because the spare main word line 22 is rendered to be low level by the spare decoder 20.

On the other hand, in replacement operation, any one of the coincidence detection signals HIT0 to HIT3 delivered out of the coincidence comparison circuits P0 to P3 of the spare decoder 20 is rendered to be high level as in the case of FIG. 1. As a result, part of the main driver 6 associated with the normal memory array 32 is deactivated and the spare main word line 22 associated with the spare memory array 34 is activated in order that given one of the subdrivers SDR0 to SDR3 associated with the spare memory block 52 which corresponds to a defective address can be selected by the subdecoder 10 and a defective subdriver is replaced with a spare memory cell by the aid of an address A0. For example, in the case of the subdriver SD10 for driving word line W11 having a defect at point B as shown in FIG. 2, its defective address is compared with an external address represented by A1 to A7 at coincidence comparison circuit P1, SDR1 of spare subdriver 14 laid in one to one correspondence relation with the SD1 of the normal subdriver 14 is selected and the defective word line W11 is replaced with spare word line SW11 by the aid of the address A0 (see arrows).

Similarly, the other defective address points A, C and D are distributed to subdrivers SDR0, SDR2 and SDR3 associated with the same spare main word line 22 so as to replace defective subdrivers (see arrows).

With the above construction, in the semiconductor memory apparatus 2, an address for selecting a subdriver is connected in common to the normal and spare memory blocks in a unit of one of the plurality of subdrivers connected to a desired main word line in the normal memory array 32 and under the fixed condition, a word line group 26 connected to a normal subdriver being in association with a defective cell can be replaced with a word line group 26 of a spare subdriver. In the semiconductor memory apparatus, since only one spare main word line participates in the replacement of a defect associated with each of the plurality of different normal main word lines, it is expected that the yield can be improved as compared to the conventional replacement carried out in a unit of main word line or memory block.

The number of each of the first and second row addresses and the division into the first and second addresses change depending on the size of the memory apparatus and the address values shown in the present embodiment are not limitative. For example, the number of word lines connected to each subdriver can be one or more as desired. The number of word lines to be replaced collectively in the present embodiment or the number of divisions of the memory block reflects principal factors of the yield, such as particle size of crystal defects and dusts occurring during processing, and the number of word lines of word line group 26 may be sized to the same level as that of the defect particle size or less. Further, in the event that the normal main word line 8 per se is defective, each memory block must be replaced and this can obviously be accomplished by programming subdrivers of the size corresponding to the main memory block, that is, four subdrivers in the present embodiment in a coincidence comparison circuit in advance.

FIG. 3 is a block diagram of a semiconductor memory apparatus showing a third embodiment of the present invention.

In FIG. 3, an improvement on the FIG. 2 apparatus is shown. In FIG. 3, the same components as those of FIG. 1 are designated by identical reference numerals and will not be described herein.

In FIG. 3, numeral 36 designates a subdriver decoder and 38 a tri-state type driver. Denoted by A0 to A2 is a second row address of which A0 is a row address for selection of any one of two word lines standing for the output of each of the subdrivers SD00 to SD313 or each of the subdrivers SDR0 to SDR3 and by A1 to A2 is a row address for selection of one of subdrivers in the normal memory block. Denoted by E to H are defective rows or defective memory cells wherein subdrivers SD01, SD11, SD22 and SD33 as hatched correspond to the above E to H and their addresses are stored as defective addresses in the coincidence comparison circuits P0 to P3 in a unit of address for selection of subdriver.

Next, the operation of the present embodiment will be described. In normal operation, the subdriver decoder 36 and tri-state type driver 38 are both activated and coincidence detection signals HIT0 to HIT3 are in high-impedance state. Consequently, the output of the subdriver decoder 36 is passed to behave as an input signal to the subdecoder 10. Accordingly, the subdecoder 10 operates by responding to an input signal in the form of a second row address A0 to A2. As a result, word line selecting operation in accordance with a normal main word line 8 and an output of the subdecoder 10 is carried out.

On the other hand, in replacement operation, a defective address stored in the coincidence comparison circuit P0, P1, P2 or P3, that is, an address for selection of subdriver is compared with an external address represented by A1 to A7 and when coincidence occurs, outputs of the coincidence comparison circuits provide an inhibit signal 24 which is high level. Consequently, the output of subdriver decoder 36 which is inputted to the subdecoder 10 in normal operation is caused by the output of tri-state type driver 38 to assume high impedance.

On the other hand, the coincidence comparison signals HIT0 to HIT3, of which any one is high level and the others are low level, are inputted to the subdecoder 10. As a result, in a subdriver associated with the spare main word line 22 and corresponding to high level of one of the HIT0 to HIT3, a given word line is selected. For example, a point E in FIG. 3 is a defective address on a word line W02 associated with the second subdriver for a normal memory block 50 and the defective row address is stored in the coincidence comparison circuit P0 in a unit of address for selection of subdriver.

In replacement operation, when the external address A1 to A7 coincides with the address for selection of the subdriver SD1 stored in the coincidence comparison circuit P0, the coincidence comparison signal HIT0 becomes high level. On the other hand, since the other HIT1 to HIT3 are low level, the first subdriver SDR0 for the spare memory block 52 is selected through the subdecoder 10 and a spare word line SW00 is then selected by the aid of the address A0.

A point F is a defective address on a word line W13 associated with a subdriver, which is the second as above, for another normal memory block 50, an address for selection of the subdriver is stored in the coincidence comparison circuit P1 and its coincidence comparison signal HIT1 selects the second spare subdriver SDR1. Similarly, the other defective addresses G and H are respectively replaced with the subdrivers SDR2 and SDR3 associated the same spare main word line 22.

As described above, in the present embodiment, the subword selection line 12 corresponding to the plurality of different main word lines 8 does not replace a subdriver corresponding to a given address as in the case of FIG. 2 but can be replaced with the position of a desired subdriver. Especially, since the number of wiring lines of the subword selection line 12 for driving subdrivers can be the same as that in FIG. 2, replacement of positions of desired individual subdrivers associated with different main word lines 8 can be effected without increasing the number of wiring lines in the memory array succeeding the subdecoder. In other words, the present embodiment is advantageous in that the replacement position can be decoded outside the arrangement of the subdriver and memory array without affecting the arrangement of the main driver, subdriver and memory array.

The coincidence detection signals HIT0 to HIT3 delivered in normal operation without replacement are at high impedance, that is, placed in open condition but if the logic scheme is set up such that the inhibit signal 24 standing for the logical sum output of these signals is low level in normal operation and high level in replacement operation, the main driver 6 will not operate erroneously. Obviously, replacement operation as above can be realized even when the tri-state type driver 38 is replaced with a logical circuit such as NAND or NOR.

On the other hand, in the semiconductor memory apparatus according to the present invention, the aforementioned memory block is not limitative and the semiconductor memory apparatus may be applied to any array configuration which has a classified structure having a main word line and a memory block comprised of memory cells each associated with a plurality of word lines. Then, the size of row address and the manner of division of the row address into the first and second addresses can be modified as necessary. Further, in the foregoing embodiment of FIG. 1, a plurality of subword selection lines 12 standing for the outputs of the subdecoder 10 provide address signals which are the same for different columns of the memory array with subdrivers 40 but the above embodiment may be utilized even when each of the plurality of subword selection lines 12 is associated with an address for selection of a column of the memory array in order that a row address of subdrivers for the normal and spare memory blocks in a given column or a given memory array with subdrivers 40 can be set.

Figure 4:
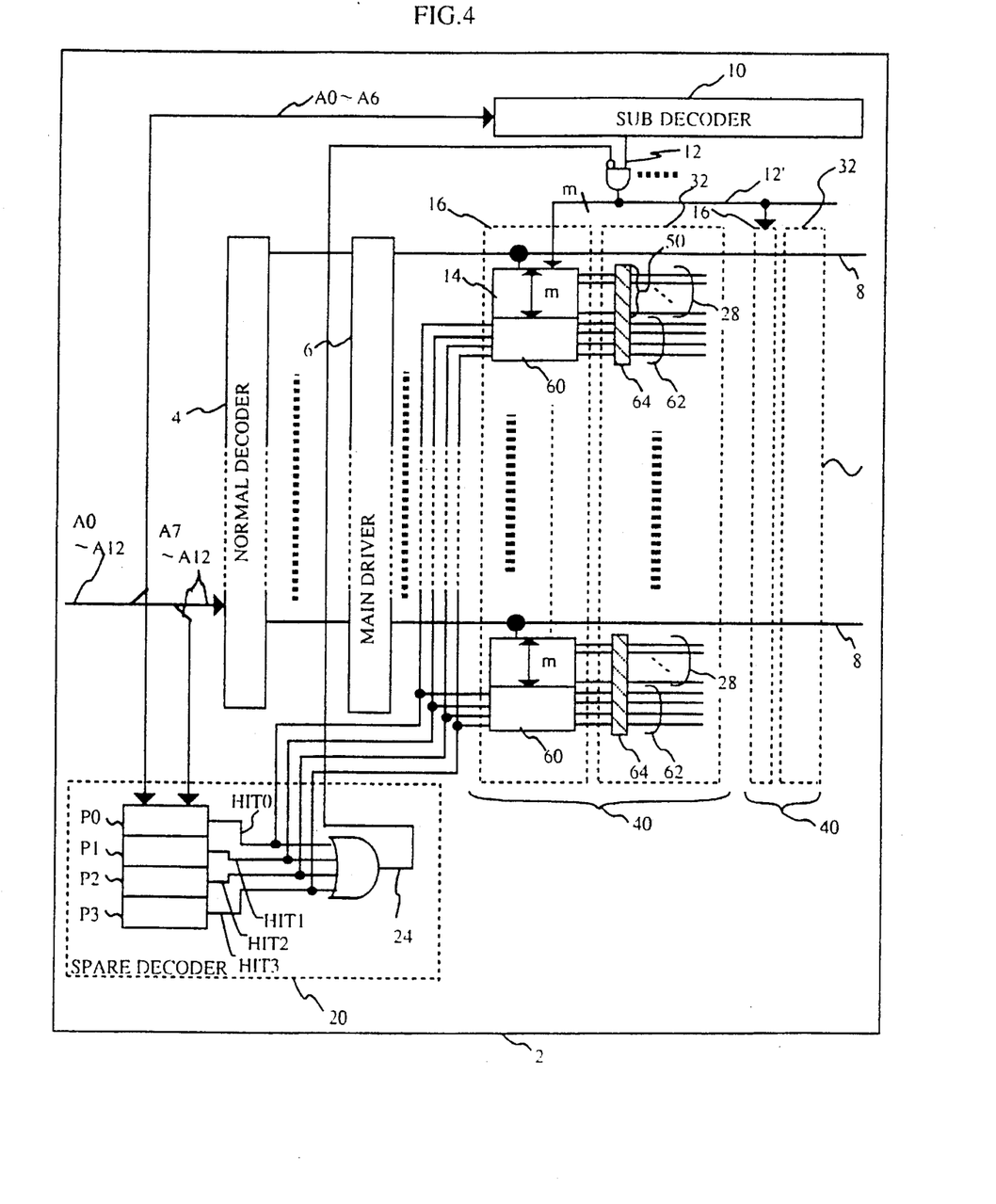
FIG. 4 is a block diagram of a semiconductor memory apparatus showing a fourth embodiment of the present invention.

FIG. 4 is a block diagram of a semiconductor memory apparatus showing a fourth embodiment of the present invention. In FIG. 4, the same components as those in FIG. 1 are designated by identical reference numerals and will not be described herein. In the Figure, numeral 12' designates an output signal line of m address decoding signals which is a subword selection line for selection of 64 word lines on the basis of an address A0 to A6 and is logically affected by an inhibit signal 24 to inhibit the selection. Denoted by 60 is a spare subdriver added to a subdriver group 14 for a memory block, by 62 a spare word line standing for the output of the subdriver group 14 and by 64 a memory block in which a memory block 50 incorporates at least one spare memory block.

Thus, in the present embodiment, the memory block 50 is associated with the spare subdriver 60 and replacement line 62 so that a defective memory cell or a defective word line occurring in the memory block 50 may be replaced with a spare replacement line added to the same block.

In the present embodiment, in normal operation without any defective address, the selection of a plurality of word lines 28 of a subdriver group 14 is not inhibited by the inhibit signal 24 and the word lines are activated. At that time, coincidence detection signals HIT0 to HIT3 are in deselection state and the spare word line 62 is deactivated.

On the other hand, in the event of occurrence of a defective address, that is, in replacement operation, the selection of the word lines 28 is inhibited by the inhibit signal 24 and in the spare subdriver 60 associated with the block, a spare word line 62 is selected by one of the coincidence detection signals HIT0 to HIT3 selectively activated in accordance with the defective address and the selective activation of a main word line 8.

Through this, the spare main word line 22 and the associated circuit in FIGS. 1 to 3 can be dispensed with and advantageously, the drive circuit of the spare word line can be simplified and can be decreased in area as compared to the case of FIGS. 1 to 3.

Obviously, the devices used in the semiconductor memory apparatus according to the present embodiment may be realized in the same way with MOS transistors, bipolar transistors, ROM's comprised of composite devices of MOS transistors and bipolar transistors, EPROM's erasable with ultraviolet rays and electrically writable, electrically erasable and writable EEPROM's, non-volatile memories such as flash type EEPROM's for collective erasure of a plurality of memory cells, memories such as DRAM's or SRAM's, multiport type memories, memories having a parity bit and spare bit for error correction code, composite memories comprised of the above memories or LSI's with memories. In a memory apparatus of contactless array structure in which one contact between memory cell and data line for transmission and reception of information is provided in common to a plurality of cells, the cell area is small and the repetitive layout of word lines is narrowed, making it difficult to arrange the normal or spare decoder and the main driver. Accordingly, for a classified row decode circuit comprised of a main decoder and a subdecoder, the present embodiment is effective which can decrease the area of the main driver without increasing the number of signals in the subword selection line.

On the other hand, in the present embodiment, the replacement method is such that for example, a plurality of word lines associated with the normal memory block of the semiconductor memory apparatus are replaced collectively but when information is managed in terms of concept of a bit size of sector, for example, 256 bytes, 512 bytes or $2^{10+n}$ bytes, a plurality of word lines corresponding to the bit number may be put together or replacement is carried out by making correspondence of the number of division of the normal memory block to the sector. Namely, various modifications can be practiced without departing from the framework of the present invention.

As described above, according to the present invention, since the coincidence comparison circuit of redundancy circuit for storing a defective address and comparing the defective address with an external address is applied with a row address for subdriver selection forming part of the second row address in addition to the first row address for main word line selection, the number of lines to be replaced can be increased without increasing the number of main drivers. By properly setting the number of divisions of the memory block in accordance with the size of defect, that is, the number of word lines replaceable at a time, the chip area can be reduced and the yield can be improved.

We claim:

1. A semiconductor memory apparatus having a normal memory array which includes a plurality of memory blocks each comprised of a predetermined number of memory cells arranged in row and column directions and having a redundancy spare memory array which includes at least one memory block arranged in the row direction, comprising:

(a) a plurality of normal main word lines for selecting normal memory block groups in said normal memory array, each group being comprised of a number of memory blocks in the row direction in said normal memory array, a plurality of normal word lines for selecting memory cells of each of said memory blocks in each group, at least one spare main word line for selecting said memory block in said redundancy spare memory array, and a plurality of spare word lines for selecting memory cells of said memory block in said redundancy spare memory array;

(b) a normal decoder for selecting one of said plurality of normal main word lines on the basis of a first row address which is a divisional part of a row address, a spare decoder for selecting said spare main word line, and a main driver for delivering signals of said normal and spare main decoders;

(c) a subdecoder for selecting one row from a plurality of rows of said memory blocks in said normal memory array on the basis of a second row address which is the remainder of said row address, and normal subdrivers for driving an output signal of said subdecoder; and (d) spare subdrivers for driving a spare word line of said memory block in said redundancy spare memory array on the basis of a signal of said spare decoder, said spare decoder being responsive to said first row address and a partial address of said second row address to send an inhibit signal to said main driver for driving a normal main word line in said normal memory array to inhibit selection operation when said first row and partial addresses represent an address of a defective cell row in said normal memory array and to select said spare main word line so as to select one cell from memory cells belonging to said memory block in said redundancy spare memory array.

2. A semiconductor memory apparatus according to claim 1, wherein a word line connected to a defective memory cell or a defective word line occurring in said memory blocks in said normal memory array is replaced with a spare word line provided in said memory block in said redundancy spare memory array.

3. A semiconductor memory apparatus according to claim 2, wherein said normal memory array, said redundancy spare memory array, said normal and spare decoders, said main driver, said subdecoder, said normal subdrivers and said spare subdrivers are provided in a single semiconductor chip.

4. A semiconductor memory apparatus according to claim 1, wherein said normal memory array, said redundancy spare memory array, said normal and spare decoders, said main driver, said subdecoder, said normal subdrivers and said spare subdrivers are provided in a single semiconductor chip.

* * * * *